(12) United States Patent
Konishi et al.

(10) Patent No.: US 11,094,372 B1
(45) Date of Patent: Aug. 17, 2021

(54) PARTIAL WRITING METHOD OF DRAM MEMORYL DEVICE TO REDUCE POWER CONSUMPTION ASSOCIATED WITH LARGE VOLTAGE SWING OF INTERNAL INPUT/OUTPUT LINES

(71) Applicant: Powerchip Semiconductor Manufacturing Corporation, Hsinchu (TW)

(72) Inventors: Yasuhiro Konishi, Osaka Fu (JP); Yasuji Koshikawa, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/868,544

(22) Filed: May 7, 2020

(51) Int. Cl.
| | |
|---|---|
| *G11C 7/10* | (2006.01) |
| *G11C 11/4096* | (2006.01) |
| *G11C 11/408* | (2006.01) |
| *G11C 11/4094* | (2006.01) |
| *G11C 11/4063* | (2006.01) |

(52) U.S. Cl.
CPC ............ *G11C 11/4096* (2013.01); *G11C 7/10* (2013.01); *G11C 7/1078* (2013.01); *G11C 11/4063* (2013.01); *G11C 11/4085* (2013.01); *G11C 11/4087* (2013.01); *G11C 11/4094* (2013.01)

(58) Field of Classification Search
CPC ............ G11C 11/4096; G11C 11/4063; G11C 7/1078; G11C 7/10; G11C 11/4094; G11C 11/4085; G11C 11/4087
See application file for complete search history.

(56) References Cited

U.S. PATENT DOCUMENTS

| | | | | |
|---|---|---|---|---|
| 5,732,241 | A | * | 3/1998 | Chan .................. G06F 12/0802 711/131 |
| 6,400,597 | B1 | | 6/2002 | Nagaoka |
| 7,117,307 | B2 | | 10/2006 | Oh |
| 7,808,850 | B2 | | 10/2010 | Tomita |

(Continued)

FOREIGN PATENT DOCUMENTS

TW           201329987        7/2013

OTHER PUBLICATIONS

"Office Action of Taiwan Counterpart Application", dated Mar. 10, 2021, p. 1-p. 4.

*Primary Examiner* — Mushfique Siddique
(74) *Attorney, Agent, or Firm* — JCIPRNET

(57) ABSTRACT

A semiconductor memory and a partial writing method are provided. The semiconductor memory includes a memory bank, a write amplifier circuit, a plurality of input/output pins and a plurality of address pins. The write amplifier circuit is coupled to the memory bank through a plurality of internal input/output lines. The plurality of input/output pins are coupled to the write amplifier circuit through a plurality of input lines. A part of plurality of address pins receive a column address instruction, and at least one of another part of the plurality of address pins receive an operation code. The semiconductor memory determines a part of the internal input/output lines for transmitting input data according to the operation code, and operates the write amplifier circuit to perform a partial writing mode according to the operation code so as to write the input data into the memory bank according to the column address instruction.

22 Claims, 6 Drawing Sheets

(56) References Cited

U.S. PATENT DOCUMENTS

| | | | |
|---|---|---|---|
| 8,006,033 B2 | 8/2011 | Bains | |
| 8,122,204 B2 | 2/2012 | Nagao et al. | |
| 8,364,882 B2 | 1/2013 | Bains | |
| 8,452,918 B2 | 5/2013 | Ding | |
| 9,411,678 B1 | 8/2016 | Ware et al. | |
| 10,445,177 B2 | 10/2019 | Reed et al. | |
| 2002/0029365 A1* | 3/2002 | Sato | G06F 11/10 |
| | | | 714/763 |
| 2006/0112321 A1* | 5/2006 | Leung | G06F 11/1056 |
| | | | 714/774 |
| 2013/0003484 A1* | 1/2013 | Parashar | G11C 7/18 |
| | | | 365/230.03 |
| 2014/0331101 A1* | 11/2014 | Chung | G06F 11/1056 |
| | | | 714/755 |
| 2017/0308299 A1* | 10/2017 | Cha | H03M 13/13 |

* cited by examiner

PARTIAL WRITING METHOD OF DRAM MEMORYL DEVICE TO REDUCE POWER CONSUMPTION ASSOCIATED WITH LARGE VOLTAGE SWING OF INTERNAL INPUT/OUTPUT LINES

BACKGROUND

Technical Field

The disclosure generally relates to memory data access techniques, in particular, to a semiconductor memory and a partial writing method thereof.

Description of Related Art

In the general semiconductor memory having the hyper-multi internal input/output lines, for example, between the sense amplifiers and the input/output pins, because the internal input/output lines of the semiconductor memory used for transmitting the input data or the output data to write the input data into or read the output data from the memory bank may cause multiple voltage swings with large voltage differences on the internal input/output lines, the general semiconductor memory consumes very large power supply current during the memory reading operation or the memory writing operation. Especially, when the semiconductor memory performs the memory writing operation, because the internal input/output lines may swing in full voltage, the internal input/output lines may consume two or three times larger current during the memory writing operation than the memory reading operation. Therefore, regarding how to reduce the power consumption caused by the memory writing operation on the internal input/output lines, solutions of several embodiments are provided below.

SUMMARY

The disclosure is directed to a semiconductor memory and a partial writing method thereof capable of providing better memory data access efficiency.

The semiconductor memory of the disclosure includes a memory bank, a write amplifier circuit, a plurality of input/output pins and a plurality of address pins. The write amplifier circuit is coupled to the memory bank through a plurality of internal input/output lines. The plurality of input/output pins are coupled to the write amplifier circuit through a plurality of input lines. A part of plurality of address pins is configured to receive a column address instruction, and at least one of another part of the plurality of address pins is configured to receive an operation code during a data writing period. The semiconductor memory determines a part of the plurality of internal input/output lines for transmitting input data according to the operation code, and operates the write amplifier circuit to perform a partial writing mode according to the partial writing instruction so as to write the input data into the memory bank through the part of the plurality of internal input/output lines according to the column address instruction.

In an embodiment of the disclosure, the semiconductor memory further includes a control logic, an address register, a mode register and an amplifier controller. The address register is coupled to the plurality of address pins, and configured to receive the column address instruction and the operation code. The control logic is configured to provide a mode register setting command. The mode register is coupled to the address register, and configured to receive the mode register setting command provided by the control logic, and output a mode selection signal. The amplifier controller is coupled to the mode register and the write amplifier circuit, and configured to receive the mode selection signal to control the write amplifier circuit to perform the partial writing mode according to the mode selection signal.

In an embodiment of the disclosure, the semiconductor memory further includes a column address latch. The column address latch is coupled to the address register and the write amplifier, and configured to receive the column address instruction and the operation code provided by the address register. The column address latch provides the partial writing instruction to the write amplifier circuit, so that the write amplifier circuit is controlled by the amplifier controller to write the input data into the memory bank through the plurality of internal input/output lines.

In an embodiment of the disclosure, the semiconductor memory further includes a column decoder. The column decoder is coupled to the column address latch and the memory bank. The column address latch provides the column address instruction to the column decoder, so that the column decoder determines a partial writing region in the memory bank according to the column address instruction.

In an embodiment of the disclosure, the semiconductor memory further includes a row address latch and a row decoder. The row address latch is coupled to the address register. The row decoder is coupled to the row address latch and the memory bank. The address register is further configured to receive a row address instruction through the address pins, and the row address latch is configured to receive the row address instruction provided by the address register and output the row address instruction to the row decoder, so that the column decoder and the row decoder determine the partial writing region in the memory bank according to the column address instruction and the row address instruction.

In an embodiment of the disclosure, the operation code includes a specific partial writing instruction, and the amplifier controller is further coupled to the column address latch. The amplifier controller is configured to receive the specific partial writing instruction provided by the column address latch to control the write amplifier circuit to perform the partial writing mode in an on-the-fly manner.

In an embodiment of the disclosure, the specific partial writing instruction is 1-bit data, and the specific partial writing instruction is received through another one of another part of the plurality of address pins.

In an embodiment of the disclosure, the internal input/output lines is classified into a plurality of input/output line groups, and the operation code includes N-bits data, wherein the N is a positive integer, and the write amplifier circuit selects one of the plurality of input/output line groups according to the N-bits data to write the input data into the memory bank through the one of the plurality of input/output line groups.

In an embodiment of the disclosure, when the plurality of address pins are configured to receives a row address instruction through the plurality of address pins.

In an embodiment of the disclosure, the plurality of address pins are further configured to receive another column address instruction through the part of the plurality of address pins and the at least one of another part of the plurality of address pins are undefined during a data reading period.

In an embodiment of the disclosure, the semiconductor memory further includes a bank selection pin, another memory bank and another write amplifier circuit. The bank selection pin is configured to receive a bank selection instruction. The another write amplifier circuit is coupled to the another memory bank through another plurality of internal input/output lines, and coupled to the plurality of address pins through the plurality of input lines. The semiconductor memory selects the write amplifier circuit or the another write amplifier circuit to perform a partial writing on the memory bank or the another memory bank according to the bank selection instruction, so that the write amplifier circuit or the another write amplifier circuit writes the input data into the memory bank or the another memory bank through the part of the plurality of internal input/output lines or a part of the another plurality of internal input/output lines.

The partial writing method of the disclosure is adapted to a semiconductor memory The partial writing method includes the following steps: receiving a column address instruction through a part of a plurality of address pins and receiving an operation code through at least one of another part of the plurality of address pins during a data writing period; determining a part of the plurality of internal input/output lines for transmitting input data according to the operation code; and operating a write amplifier circuit to perform a partial writing mode according to the operation code to write the input data into a memory bank through the part of the plurality of internal input/output lines according to the column address instruction.

Based on the above, according to the semiconductor memory and the partial writing method thereof of the disclosure, the semiconductor memory is capable of performing the partial writing mode to efficiently reduce the power consumption caused by the memory writing operation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
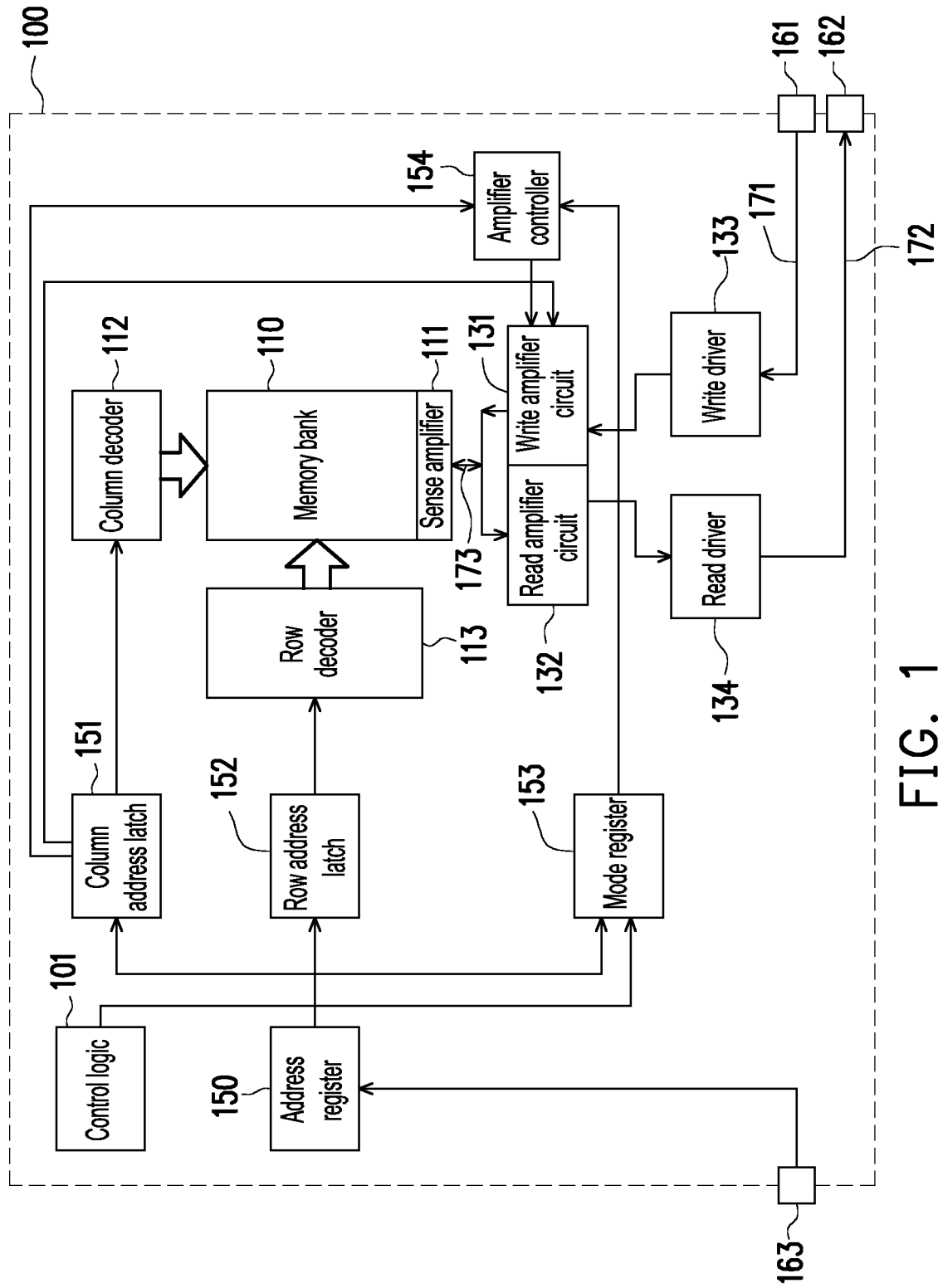
FIG. 1 is a function block diagram of a semiconductor memory according to an embodiment of the disclosure.

The accompanying drawings are included to provide a further understanding of the disclosure, and are incorporated in and constitute a part of this specification. The drawings illustrate exemplary embodiments of the disclosure and, together with the description, serve to explain the principles of the disclosure.

The term "couple" used throughout this specification (including the claims) may refer to any direct or indirect connection means. For example, if it is described that the first device is coupled to the second device, it should be understood that the first device may be directly connected to the second device or indirectly connected to the second device through other devices, wires, or certain connection means. Moreover, elements/components/steps with the same reference numerals represent the same or similar parts in the figures and embodiments where appropriate. Descriptions of the elements/components/steps with the same reference numerals or terms in different embodiments may be references for one another.

FIG. 1 is a function block diagram of a semiconductor memory according to an embodiment of the disclosure. Referring to the FIG. 1, the semiconductor memory 100 includes a control logic 101, a memory bank 110, a sense amplifier 111, a write amplifier circuit 131, a write driver 133, an input interface 161 and an address instruction interface 163. The write amplifier circuit 131 is coupled to the memory bank 110 through the sense amplifier 111 and a plurality of internal input/output lines 173, and the write amplifier circuit 131 includes a plurality of write amplifiers. The write amplifier circuit 131 is coupled to the write driver 133. The input interface 161 includes a plurality of input pins, and the input interface 161 is coupled to the write amplifier circuit 131 and the write driver 133 through a plurality of input lines 171. The address instruction interface 163 includes a plurality of address pins. In the embodiment of the disclosure, the memory 100 may be a dynamic random-access memory (DRAM), but the disclosure is not limited thereto. Furthermore, the control logic 101 is configured to receive one or more control instructions to control the semiconductor memory 100 and the above memory internal circuits to perform a memory writing operation or a memory reading operation.

In the embodiment of the disclosure, when the semiconductor memory 100 is operated in a data writing period, a part of the address pins of the address instruction interface 163 receives a column address instruction, and at least one of another part of the address pins receives an operation code during the data writing period. Then, the semiconductor memory 100 determines a part of the internal input/output lines 173 for transmitting input data according to the operation code. The write driver 133 receives the input data through the input lines 171 from the input pins of the input interface 161, and provides the input data to the write amplifier circuit 131, so that the semiconductor memory 100 can operate the write amplifier circuit 131 to perform a partial writing mode according to the operation code to write the input data into the memory bank 110 through the part of the internal input/output lines 173 and the sense amplifier 111 according to the column address instruction. Therefore, the semiconductor memory 100 of the disclosure can perform a partial writing on the memory bank 110 through the part of the internal input/output lines 173, so as to efficiently reduce the power consumption caused by using all the internal input/output lines 173 for memory writing.

In the embodiment of the disclosure, the semiconductor memory 100 further includes a column decoder 112, a row decoder 113, an address register 150, a column address latch 151, a row address latch 152, a mode register 153 and an amplifier controller 154. The column decoder 112 and the row decoder 113 are coupled to the memory bank 110. The address register 150 is coupled to the address pins of the address instruction interface 163, and coupled to the column address latch 151, the row address latch 152 and the mode register 153. The mode register 153 is further coupled to the control logic 101 and the amplifier controller 154. The column address latch 151 is coupled to the column decoder 112. The row address latch 152 is coupled to the row decoder 113. The amplifier controller 154 is coupled to the column address latch 151 and the write amplifier circuit 131. In the embodiment of the disclosure, the mode register 153 is configured to set the semiconductor memory 100 to operate in, for example a reading mode, a normal writing mode, a partial writing mode or a partial writing on-the-fly mode by a mode register setting command, and the semiconductor memory 100 maintains the previously set accesses mode until the mode register 153 receives a next mode register setting command.

More detailed explanation, when the semiconductor memory 100 performs the partial writing operation, the address register 150 receives the column address instruction and the operation code from the address pins of the address instruction interface 163. The address register 150 The control logic 101 may provide the mode register setting command to the mode register 153, so that the mode register 153 sets the semiconductor memory 100 to operate some specific access operations, such as the partial writing operation. The mode register 153 receives the mode register setting command provided by the control logic 101 to provide a mode selection signal to the amplifier controller 154 according to the mode register setting command. That is, the mode register 153 sets the memory access mode according to the mode register setting command, and the amplifier controller 154 controls the write amplifier circuit 131 to perform the partial writing mode according to the mode selection signal. Thus, the write amplifier circuit 131 is controlled by the amplifier controller 154 to drive the input data to the sense amplifier 111 through the part of the internal input/output lines 173 so as to write the input data into the memory bank 110. Moreover, the column address latch 151 receives the column address instruction and the operation code provided by the address register 150, and the column address latch 151 provides the column address instruction to the column decoder 112, so that the column decoder 112 determines a partial writing region in the memory bank 110 according to the column address instruction. Therefore, the write amplifier circuit 131 performs the partial writing on the memory bank 110. That is, the write amplifier circuit 131 writes the input data through the part of the internal input/output lines 173 into the partial writing region in the memory bank 110, so as to efficiency reduce the power consumption caused by using all the internal input/output lines 173 for memory writing.

Furthermore, in the embodiment of the disclosure, the address register 150 is further configured to receive a row address instruction through the address pins of the address instruction interface 163, and the row address latch 152 is configured to receive the row address instruction provided by the address register 150 and output the row address instruction to the row decoder 113 during the data writing period, so that the column decoder 112 and the row decoder 113 determine the partial writing region in the memory bank 110 according to the column address instruction and the row address instruction. However, in one embodiment of the disclosure, the number of address pins of the address instruction interface 163 may be determined by row address. In other words, the number of address pins for receiving the row address instruction may be greater than the number of address pins for receiving the column address instruction.

In the embodiment of the disclosure, the internal input/output lines 173 may be classified into a plurality of input/output line groups, and the operation code includes N-bits data, wherein the N is a positive integer. The column address latch 151 provides the N-bits data (the operation code) to the write amplifier circuit 131, so that the write amplifier circuit 131 selects one of the input/output line groups according to the N-bits data to receive the input data from the one of the input/output line groups. In one embodiment of the disclosure, the operation code may include a specific partial writing instruction, and the amplifier controller 154 is further coupled to the column address latch 151. The amplifier controller 154 may be further configured to receive the specific partial writing instruction to control the write amplifier circuit 131 to perform the partial writing mode on-the-fly manner. The specific partial writing instruction may be 1-bit data, and the specific partial writing instruction is transmitted through one of the address pins of the address instruction interface 163.

In addition, the semiconductor memory 100 further includes a read amplifier circuit 132 and a read driver 134 and an output interface 162. The read amplifier circuit 132 is coupled to the memory bank 110 through the sense amplifier 111 and the internal input/output lines 173, and the read amplifier circuit 132 includes a plurality of read amplifiers. The read amplifier circuit 132 is coupled to the read driver 134 and the amplifier controller 154. The mode register 153 receives the mode register setting command to set the amplifier controller 154, so as to further set the write amplifier circuit 131 or the read amplifier circuit 132 to perform the memory reading operation or the memory writing operation. The output interface 162 includes a plurality of output pins, and the output interface 162 is coupled to the read amplifier circuit 132 and the read driver 134 through a plurality of output lines 172. For example, the number of the input lines 171 may be 512, and the number of the output lines 172 may also be 512, but the disclosure is not limited thereto. In other words, the bandwidth of the input lines 171 may be 512 bits, and the bandwidth of the output lines 172 may also be 512 bits. In addition, the input interface 161, the output interface 162 and the address instruction interface 163 are coupled to other circuits or modules outside the semiconductor memory 100, such as a center processor unit (CPU), an image signal processor (ISP) core, a digital signal processor (DSP) core, a graphics processing unit (GPU) core, a convolutional neural network (CNN) accelerator or the other modules having a memory access requirement, where the input/output interfaces 161 and 162 are coupled to the other circuits or the modules outside the semiconductor memory 100 through two external input/output buses. In one embodiment of the disclosure, the semiconductor memory 100 performs the memory reading operation more often than the memory writing operation.

In the embodiment of the disclosure, when the semiconductor memory 100 is operated in a data reading period, the part of the address pins are further configured to receive another column address instruction and another row address instruction, and the at least one of another part of the address pins are undefined during the data reading period. Then, the amplifier controller 154 controls the read amplifier circuit 132 to select all the internal input/output lines 173 for transmitting output data. The read amplifier circuit 132 reads the output data from the memory bank 110 through the sense amplifier 111 through the all the internal input/output lines 173 according to the another column address instruction and the another row address instruction, and read driver 134 provides the output data to the output pins of the output interface 162 through the output lines 172. In other words, the number of the address pins of the address instruction interface 163 used for receiving instruction during the data writing period is greater than the number of the address pins of the address instruction interface 163 used for receiving instruction during the data reading period.

Figure 2:
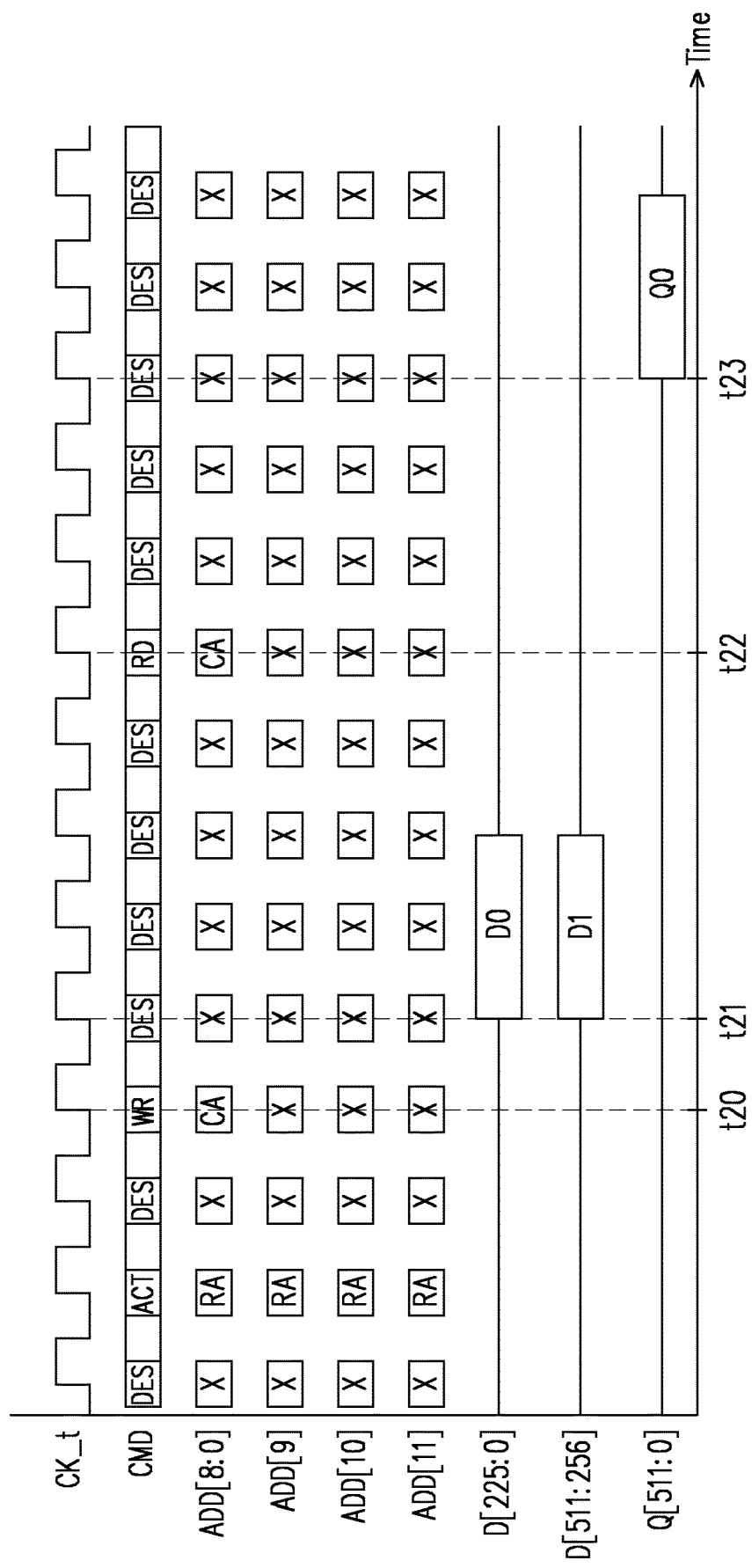
FIG. 2 is a memory operation timing diagram of a semiconductor memory operated in a normal writing mode to perform data writing according to an embodiment of the disclosure.

FIG. 2 is a memory operation timing diagram of a semiconductor memory operated in a normal writing mode to perform data writing according to an embodiment of the disclosure. Referring to FIG. 1 and FIG. 2, for example, the control logic of the semiconductor memory 100 receives a timing signal CK_t and a control signal CMD to control the semiconductor memory 100 to perform related memory operations. In the embodiment of the disclosure, the number of the address pins may be 12, the symbol ADD[8:0] in FIG. 2 is represented the first address pin to the ninth address pin. The symbol ADD[9] in FIG. 2 is represented the tenth address pin. The symbol ADD[10] in FIG. 2 is represented the eleventh address pin. The symbol ADD[11] in FIG. 2 is represented the twelfth address pin. In the embodiment of the disclosure, the tenth and the eleventh address pins (ADD[9] and ADD[10]) are configured to receive 2-bits data of the operation code, and the twelfth address pin (ADD[11]) is configured to receive 1-bit data of the specific partial writing instruction of the operation code. In other words, the 3-bits data of the above address pins (ADD[9] to ADD[11]) may form as the operation code, and the mode register 153 provides the mode selection signal to the amplifier controller 154 according to the mode register setting command, so that the amplifier controller 154 controls the write amplifier circuit 131 to select at least part of the input/output lines 173 for transmitting input data.

In the embodiment of the disclosure, the number of the internal input lines 171 may be 512, but the disclosure is not limited thereto. The input lines 171 is classified into a plurality of input line groups. Thus, the symbol D[225:0] in FIG. 2 is represented the $1^{st}$ to $256^{th}$ input lines, and the symbol D[511:256] in FIG. 2 is represented the $257^{th}$ to $512^{th}$ input lines. The symbol Q[511:0] in FIG. 2 is represented the $1^{st}$ to $512^{th}$ output lines. The number of the internal input/output lines 173 may also be 512. The internal input/output lines 173 is also classified into a plurality of internal input/output lines corresponding to the input lines 171, that is $1^{st}$ to $256^{th}$ and $257^{th}$ to $512^{th}$.

In the embodiment of the disclosure, the semiconductor memory 100 is capable of performing a quarter partial write operation. For example, if the data received by the tenth address pin (ADD[9]) is "0" and the data received by the eleventh address pin (ADD[10]) is "0", the $1^{st}$ to $128^{th}$ internal input/output lines are configured to receive the input data (through the $1^{st}$ to $128^{th}$ input lines), and the $129^{th}$ to $512^{th}$ internal input/output lines are disable. If the data received by the tenth address pin (ADD[9]) is "1" and the data received by the eleventh address pin (ADD[10]) is "0", the $129^{th}$ to $256^{th}$ internal input/output lines are configured to receive the input data (through the $129^{th}$ to $256^{th}$ input lines), and the $1^{st}$ to $128^{th}$ and the $257^{th}$ to $512^{th}$ internal input/output lines are disable. If the data received by the tenth address pin (ADD[9]) is "0" and the data received by the eleventh address pin (ADD[10]) is "1", the $257^{th}$ to $384^{th}$ internal input/output lines are configured to receive the input data (through the $257^{th}$ to $384^{th}$ input lines), and the $1^{st}$ to $256^{th}$ and the $385^{th}$ to $512^{th}$ internal input/output lines are disable. If the data received by the tenth address pin (ADD[9]) is "1" and the data received by the eleventh address pin (ADD[10]) is "1", the $385^{th}$ to $512^{th}$ internal input/output lines are configured to receive the input data (through the $385^{th}$ to $512^{th}$ input lines), and the $1^{st}$ to $384^{th}$ internal input/output lines are disable.

In another example of partial write setting, the semiconductor memory 100 is capable of performing a half partial write operation. If the data received by the tenth address pin (ADD[9]) is "0" and the eleventh address pin (ADD[10]) is "X" (undefined), the $1^{st}$ to $256^{th}$ internal input/output lines are configured to receive the input data (through the $1^{st}$ to $256^{th}$ input lines), and the $257^{th}$ to $512^{th}$ internal input/output lines are disable. If the data received by the tenth address pin (ADD[9]) is "1" and the eleventh address pin (ADD[10]) is "X" (undefined), the $257^{th}$ to $512^{th}$ internal input/output lines are configured to receive the input data (through the $257^{th}$ to $512^{th}$ input lines), and the $1^{st}$ to $256^{th}$ internal input/output lines are disable.

In the embodiment of the disclosure, because the semiconductor memory 100 is set to the normal writing mode, at time t20, the semiconductor memory 100 receives the control signal CMD to perform data writing (indicated by "WR"), the tenth and the twelfth address pins (ADD[9] and ADD[11]) are undefined (indicated by "X"), and the first address pin to the ninth address pin (ADD[8:0]) receive a column address (indicated by "CA"). Thus, the address register 150 receives the column address instruction (8-bit data from ADD[8:0]), and provides the column address instruction (8-bit data from ADD[8:0]) to the column address latch 151. The mode register 153 provides the normal writing mode signal to the write amplifier 131. The column address latch 151 provides the column address instruction (8-bit data from ADD[8:0]) to the column decoder 112, wherein the column decoder 112 decodes the 8-bit data to obtain a column address, so as to determine the normal writing region in the memory bank 110. At time t21, the write amplifier circuit 131 drives both input data D0 and D1 to the sense amplifier 111 through the $1^{st}$ to $256^{th}$ internal input/output lines and the $257^{th}$ to $512^{th}$ internal input/output lines from the input interface 161. There is, for example, one delay time between the time t20 and the time 21.

Then, at time t22, because the semiconductor memory 100 receives the control signal CMD to perform data reading (indicated by "RD"), the semiconductor memory 100 is operated in a reading mode. Further, the first address pin to the ninth address pin (ADD[8:0]) receive another column address (indicated by "CA") at the time t22. Therefore, the read amplifier circuit 132 reads output data Q0, and the read amplifier circuit 132 transmits the output data Q0 to the output interface 162 through the $1^{st}$ to $512^{th}$ internal input/output lines at the time t23. There is, for example, three delay times between the time t22 and the time t23.

In addition, the symbol "DES" in the control signal CMD of FIG. 2 indicates the control signal CMD is a deselect command, and the symbol "ACT" in the control signal CMD of FIG. 2 indicates the control signal CMD is an active command. The symbol "X" in the address pins of FIG. 2 indicates that the address pins are undefined, and the symbol "RA" in the address pins of FIG. 2 indicates that the address pins receive a row address.

In other words, when the semiconductor memory 100 is set to the normal writing mode by the mode register setting command, the mode register 153 receives the mode register setting command to set the amplifier controller 154, so as to further set the write amplifier circuit 131 to perform the normal writing operation. In the embodiment of the disclosure, when the semiconductor memory 100 is operated in the normal writing mode, the tenth to the twelfth address pins (ADD[9] to ADD[11]) are not necessary for the normal writing operation, as a result, the tenth to the twelfth address pins (ADD[9] to ADD[11]) are undefined (indicated by "X") (or described as "Don't care").

Figure 3:
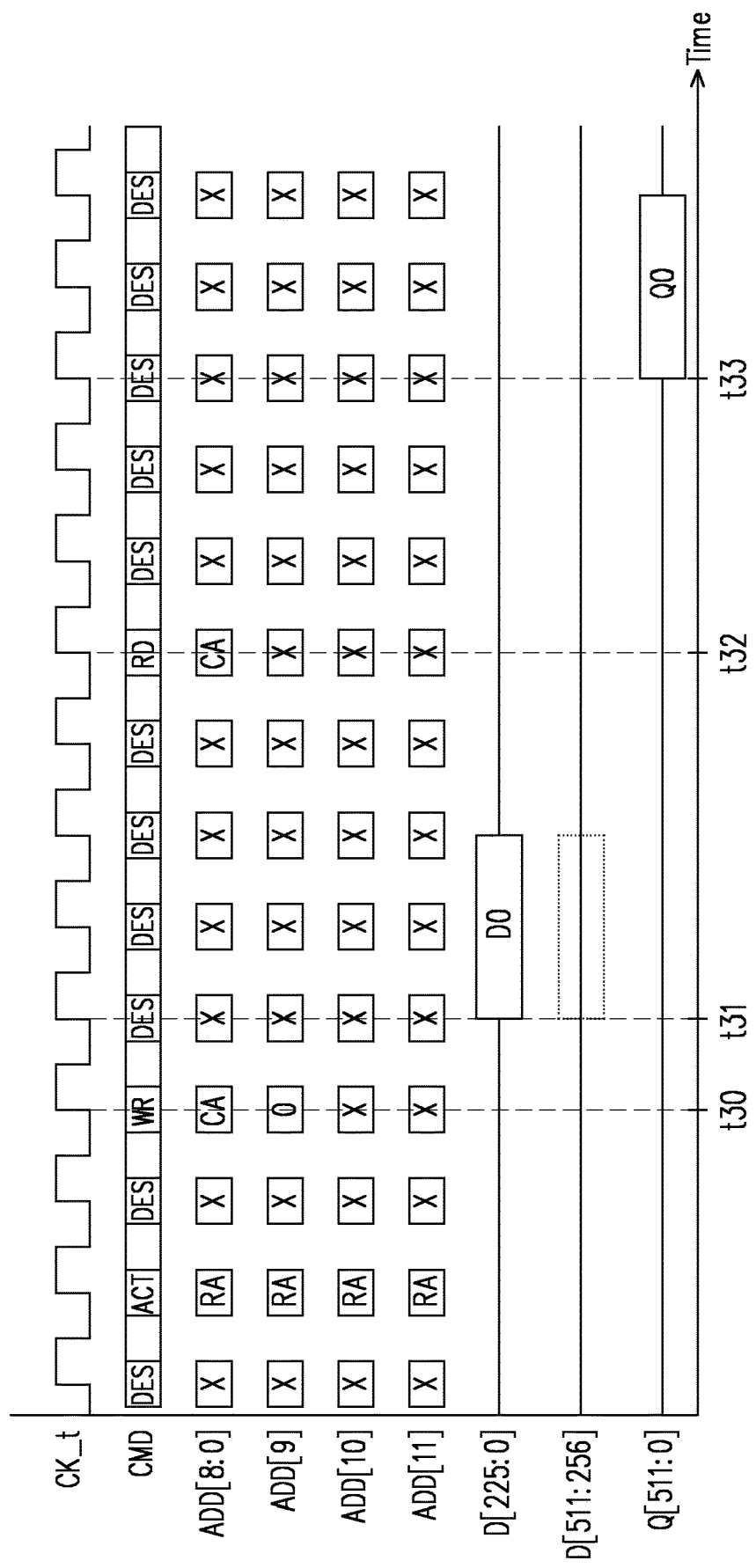
FIG. 3 is a memory operation timing diagram of a semiconductor memory operated in a partial writing mode to perform data writing according to an embodiment of the disclosure.

FIG. 3 is a memory operation timing diagram of a semiconductor memory operated in a partial writing mode to perform data writing according to an embodiment of the disclosure. Referring to FIG. 1 and FIG. 3, comparing with FIG. 2, because the semiconductor memory 100 is set to the partial writing mode, at time t30, the semiconductor memory 100 receives the control signal CMD to perform data writing (indicated by "WR"), the tenth address pin (ADD[9]) receives "0" as a partial writing address, the eleventh address pin (ADD[10]) is "X" (undefined), and the first address pin to the ninth address pin (ADD[8:0]) receive a column address (indicated by "CA"). Therefore, at time t31, the write amplifier circuit 131 drives input data D0 to the half part of the sense amplifier 111 through the $1^{st}$ to $256^{th}$ internal input/output lines, and doesn't drive the data to the other half of the sense amplifier 111 through the $257^{th}$ to $512^{th}$ internal input/output lines. There is, for example, one delay time between the time t30 and the time 31.

Then, at time t32, because the semiconductor memory 100 receives the control signal CMD to perform data reading (indicated by "RD"), the semiconductor memory 100 is operated in a reading mode. Further, the first address pin to the ninth address pin (ADD[8:0]) receive another column address (indicated by "CA") at the time t32. Therefore, the read amplifier circuit 132 reads output data Q0, and the read amplifier circuit 132 transmits the output data Q0 to the output interface 162 through the $1^{st}$ to $512^{th}$ internal input/output lines at the time t33. There is, for example, three delay times between the time t32 and the time t33.

In other words, when the semiconductor memory 100 is set to the partial writing mode by the mode register setting command, the mode register 153 receives the mode register setting command to set the amplifier controller 154, so as to further set the write amplifier circuit 131 to perform the partial writing operation. In the embodiment of the disclosure, when the semiconductor memory 100 is operated in the partial writing mode, the tenth address pin (ADD[9]) is used to assign the input data to drive to the sense amplifier 111 through the half part of the internal input/output lines (indicated by "0" or "1"), and the eleventh address pin and the twelfth address pin (ADD[10] and ADD[11]) are undefined (indicated by "X"), but the disclosure is not limited thereto. In another embodiment of the disclosure, when the semiconductor memory 100 is operated in the partial writing mode, the tenth address pin and the eleventh address pin (ADD[9] and ADD[10]) are used to assign the input data to drive to the sense amplifier 111 through the quarter part of the internal input/output lines (indicated by "0" or "1"), and the twelfth address pin (ADD[11]) is undefined (indicated by "X").

Figure 4:
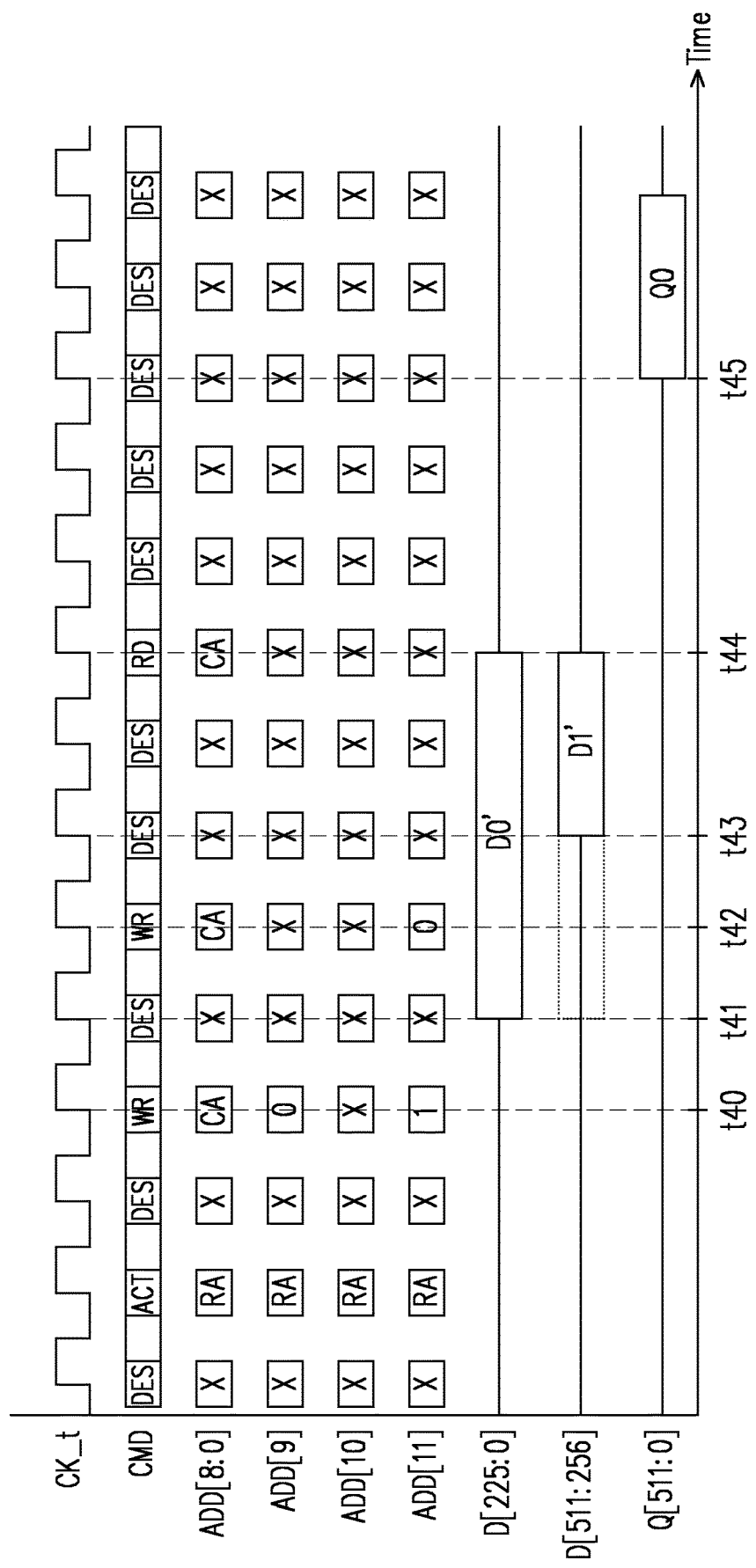
FIG. 4 is a memory operation timing diagram of a semiconductor memory operated in a partial writing mode to perform data writing in an on-the-fly manner according to another embodiment of the disclosure.

FIG. 4 is a memory operation timing diagram of a semiconductor memory operated in a partial writing mode to perform data writing in an on-the-fly manner according to another embodiment of the disclosure. Referring to FIG. 1 and FIG. 4, comparing with FIG. 3, because the semiconductor memory 100 is set to the partial writing on-the-fly mode, at time t40, the semiconductor memory 100 receives the control signal CMD to perform data writing (indicated by "WR"), the tenth address pin (ADD[9]) receives the data "0" as a partial writing address, the eleventh address pin (ADD[10]) is "X" (undefined) and the twelfth address pin (ADD[11]) receives "1" as the partial writing enable instruction. Further, the first address pin to the ninth address pin (ADD[8:0]) receive a column address (indicated by "CA") at the time t40. Therefore, at time t41, the write amplifier circuit 131 drives input data D0' to the half part of the sense amplifier 111 through the $1^{st}$ to $256^{th}$ internal input/output lines, and doesn't drive the input data to the other half of the sense amplifier 111 through the $257^{th}$ to $512^{th}$ internal input/output lines. There is, for example, one delay time between the time t40 and the time 41. However, at time t42, because the semiconductor memory 100 receives the control signal CMD to perform data writing (indicated by "WR"), and the twelfth address pin (ADD[11]) receives "0" as the partial writing disable instruction, the semiconductor memory 100 stops the partial writing mode and change to the normal writing mode. Therefore, at time t43, the write amplifier circuit 131 continuously drives input data D0' to the half part of the sense amplifier 111 through the $1^{st}$ to $256^{th}$ internal input/output lines, and the write amplifier circuit 131 starts to drive input data D1' to the other half of the sense amplifier 111 through the $257^{th}$ to $512^{th}$ internal input/output lines.

Then, at time t44, because the semiconductor memory 100 receives the control signal CMD to perform data reading (indicated by "RD"), the semiconductor memory 100 is operated in a reading mode. Further, the first address pin to the ninth address pin (ADD[8:0]) receive another column address (indicated by "CA") at the time t44. Therefore, the read amplifier circuit 132 read output data Q0, and the read amplifier circuit 132 transmits the output data Q0 to the output interface 162 through the $1^{st}$ to $512^{th}$ internal input/output lines at the time t44. There is, for example, three delay times between the time t44 and the time t45.

It should be noted that, in the embodiment of the disclosure, the semiconductor memory 100 is first set to perform the partial writing mode and then changed to perform the normal writing mode according to the twelfth address pin (ADD[11]), but the disclosure is not limited thereto. In another embodiment of the disclosure, the semiconductor memory 100 is first set to perform the normal writing mode and then changed to perform the partial writing mode according to the twelfth address pin (ADD[11]).

In other words, when the semiconductor memory 100 is set to the partial writing on-the-fly mode by the mode register setting command, the mode register 153 receives the mode register setting command to set the amplifier controller 154, so as to further set the write amplifier circuit 131 to dynamically switch to perform the normal writing operation or the partial writing operation. In the embodiment of the disclosure, when the semiconductor memory 100 is operated in the partial writing on-the-fly mode, and the twelfth address pin (ADD[11]) receives "1" as the partial writing enable instruction, the tenth address pin (ADD[9]) is used to assign the input data to drive to the sense amplifier 111 through the half part of the internal input/output lines (indicated by "0" or "1"), and the eleventh address pin (ADD[10]) is undefined (indicated by "X"), but the disclosure is not limited thereto. In another embodiment of the disclosure, the tenth address pin and the eleventh address pin (ADD[9] and ADD[10]) are used to assign the input data to drive to the sense amplifier 111 through the quarter part of the internal input/output lines (indicated by "0" or "1"). Moreover, when the semiconductor memory 100 is operated in the partial writing on-the-fly mode, and the twelfth address pin (ADD[11]) receives "0" as the partial writing disable instruction, regardless of the tenth address pin and the eleventh address pin (ADD[9] and ADD[10]), the write amplifier circuit 131 is switched to perform the normal writing operation.

Figure 5:
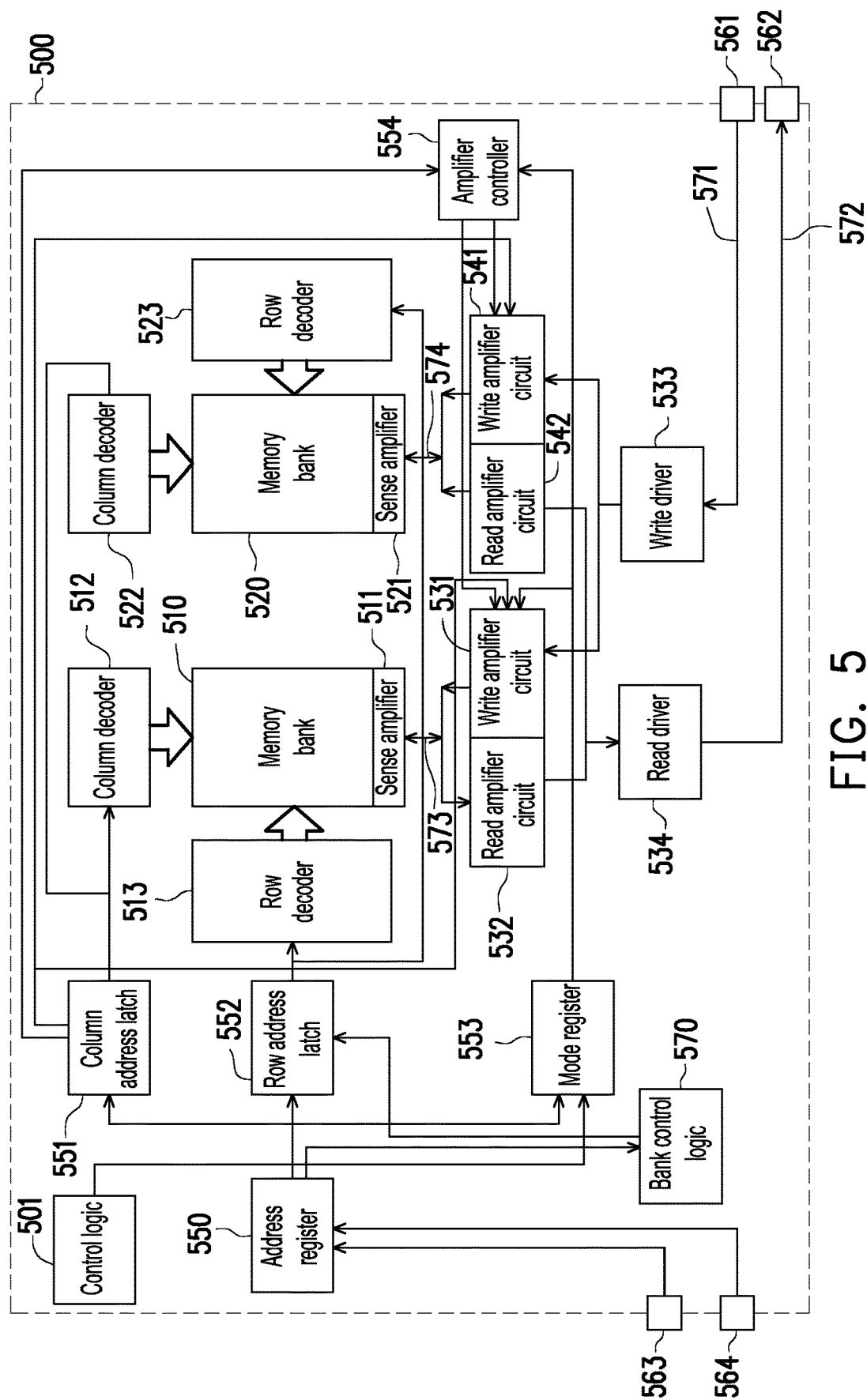
FIG. 5 is a function block diagram of a semiconductor memory according to another embodiment of the disclosure.

FIG. 5 is a function block diagram of a semiconductor memory according to another embodiment of the disclosure. Referring to FIG. 5, the semiconductor memory 500 may be a memory chip of a dynamic random-access memory (DRAM). The semiconductor memory 500 includes two memory banks 510 and 520. In the embodiment of the disclosure, the semiconductor memory 500 includes the control logic 501, the memory banks 510 and 520, sense amplifiers 511 and 521, column decoders 512 and 522, row decoders 513 and 523, write amplifier circuits 531 and 541, read amplifier circuits 532 and 542, a write driver 533, a read driver 534, an address register 550, a column address latch 551, a row address latch 552, a mode register 553 and an amplifier controller 554, an input interface 561, an output interface 562, an address instruction interface 563 and a bank selection pin 564. The input interface 561 includes a plurality of input pins, and the output interface 562 includes a plurality of output pins. The address instruction interface 563 includes a plurality of address pins.

In the embodiment of the disclosure, the address register 550 coupled to the address instruction interface 563, the bank selection pin 564 and the column address latch 551, the row address latch 552, the mode register 553 and the bank control logic 570. The mode register 553 is coupled to the control logic 501 and the amplifier controller 554. The column address latch 551 is coupled to the column decoders 512 and 522, write amplifier circuits 531 and 541 and amplifier controller 554. The column decoder 512 and the row decoder 513 are coupled to the memory bank 510. The column decoder 522 and the row decoder 523 are coupled to the memory bank 520. The write driver 533 is coupled to the write amplifier circuits 531 and 541, and coupled to the input interface 561 through a plurality of input lines 571. The read driver 534 is coupled to the read amplifier circuits 532 and 542, and coupled to the output interface 562 through a plurality of output lines 572. The write amplifier circuit 531 and the read amplifier 532 are coupled to the memory bank 510 through the sense amplifier 511 and a plurality of internal input/output lines 573. The write amplifier circuit 541 and the read amplifier 542 are coupled to the memory bank 520 through the sense amplifier 521 and a plurality of internal input/output lines 574.

In the embodiment of the disclosure, the memory banks 510 and 520 share the input lines 571 to transmit an input data for partial writing to the memory bank 510 or the memory bank 520, and share the output lines 572 to transmit an output data to output interface 562 from the memory bank 510 or the memory bank 520. In the embodiment of the disclosure, the semiconductor memory 500 may select the memory bank 510 or the memory bank 520 to perform a memory writing operation or a memory reading operation according to the bank selection instruction (1-bit) received by the bank selection pin 564. Specifically, when the address register 550 receives the bank selection instruction by the bank selection pin 564, the address register 550 provides a bank selection instruction to the bank control logic 570, so that the bank control logic 570 further provides the bank selection instruction to the row address latch 552, and the row address latch 552 selects the row decoders 513 and 523 according to the bank selection instruction. Thus, the selected one of row decoders 513 and 523 further determines the data writing region or data reading region according to a corresponding row address.

In the embodiment of the disclosure, the memory banks 510 and 520 may be operated independently. Owing to the memory banks 510 and 520 share the input lines 571 and the output lines 572, the semiconductor memory 500 may operate one of the memory banks 510 and 520 to perform the memory writing operation by receiving the input data through the input lines 571, and operate another of the memory banks 510 and 520 to perform the memory reading operation by transmitting the output data through the output lines 572 at the same time. Especially, the semiconductor memory 500 may select one of memory banks 510 and 520 to perform the partial writing mode. Specifically, when the control logic of semiconductor memory 500 receive a partial writing demand, a part of the address pins of the address instruction interface 563 receives a column address instruction, at least one of another part of the address pins receives an operation code, and the bank selection pin 564 receives the bank selection instruction. Moreover, the part of the address pins of the address instruction interface 563 additionally receives a row address instruction. Thus, the address register 550 provides the column address instruction and the operation code to the column address latch 551 and the mode register 553, provides the row address instruction to the row address latch 552, and provides the bank selection instruction to the bank control logic 570. The bank control logic 570 provides the bank selection instruction to the row address latch 552 to select one of the row decoders 513 and 523 to determinate a partial writing region in the memory bank 510 or the memory bank 520. It should be noted that, the partial writing region is determined by the column decoder 512 or the column decoder 522 received the column address instruction from the column address latch 551, and by the selected one of the row decoders 513 and 523.

In the embodiment of the disclosure, the control logic 501 provides a mode register setting command to the mode register 553, and the mode register 553 provides a mode selection signal to the amplifier controller 554 according to the mode register setting command, so that the amplifier controller 554 controls the write amplifier circuit 531 or the write amplifier circuit 541 to perform the partial writing mode according to the mode selection signal. The column address latch 551 provides the operation code to the write amplifier circuit 531 or the write amplifier circuit 541, so that the write amplifier circuit 531 or the write amplifier circuit 541 is controlled by the amplifier controller 554 to determine to receive the input data through the write driver 553 and write the input data into the memory bank 510 or the memory bank 520 through a part of the internal input/output lines 573 or a part of the internal input/output lines 574. Therefore, the semiconductor memory 500 of the disclosure may select to write the input data into the partial writing region in the memory bank 510 or the memory bank 520 through the part of the internal input/output lines 573 or the part of the internal input/output lines 574, so as to efficiently reduce the power consumption caused by using all the internal input/output lines for memory writing.

In addition, enough teachings and recommendations for other memory features, implementation details and technical features of the semiconductor memory 500 of the embodiment may be learned from related descriptions of the embodiments of FIG. 1 to FIG. 4, and details thereof are not repeated.

Figure 6:
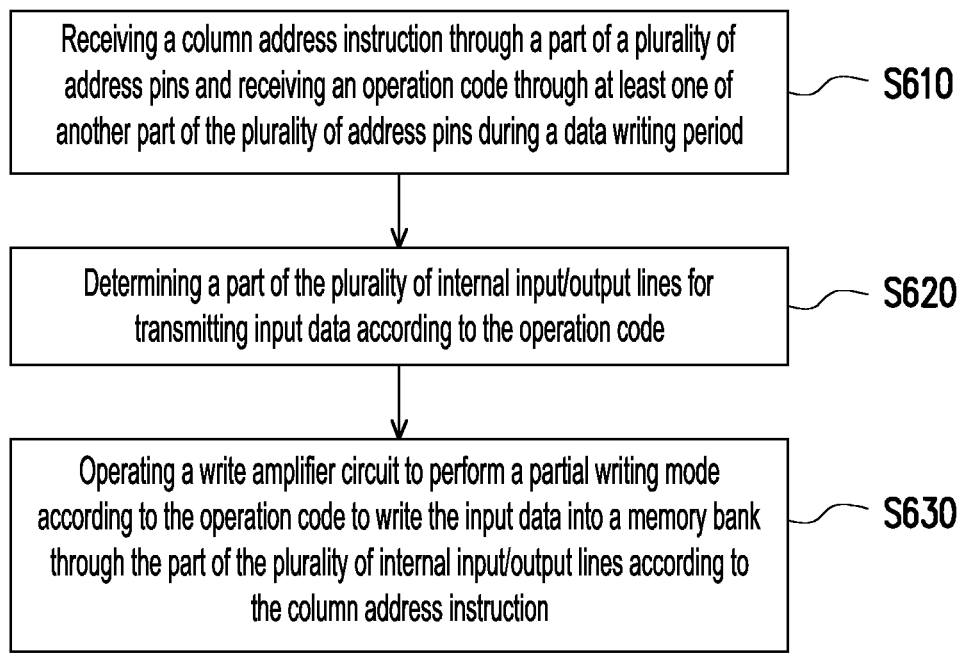
FIG. 6 is a flowchart of a partial writing method according to an embodiment of the disclosure.

FIG. 6 is a flowchart of a partial writing method according to an embodiment of the disclosure. Referring to FIG. 1 and FIG. 6, the partial writing method of FIG. 6 may be at least adapted to the semiconductor memory 100 of FIG. 1. In step S610, the semiconductor memory 100 receives the column address instruction through the part of a plurality of address pins and receiving the operation code through the at least one of another part of the address pins during the data writing period. In step S620, the semiconductor memory 100 determines the part of the internal input/output lines 173 for transmitting the input data according to the operation code. In step S630, the semiconductor memory 100 operates the write amplifier circuit to perform the partial writing mode according to the operation code to write the input data into the memory bank through the part of the plurality of internal input/output lines 173 according to the column address instruction. Therefore, owing to the write amplifier circuit 131 writes the input data into the partial writing region in the memory bank 110 through the part of the internal input/output lines 173, the semiconductor memory 100 implementing the partial writing method of FIG. 6 can efficiently reduce the power consumption caused by using all the internal input/output lines for memory writing.

In addition, enough teachings and recommendations for other memory features, implementation details and technical features of the semiconductor memory 100 of the embodiment may be learned from related descriptions of the embodiments of FIG. 1 to FIG. 5, and details thereof are not repeated.

In summary, in the semiconductor memory and the partial writing method thereof according to the disclosure are capable of performing a partial writing mode on any selected one of the memory banks in the semiconductor memory, and semiconductor memory no need to add the pins for partial writing. The semiconductor memory of the disclosure is capable of efficiently reduce the power consumption caused by using all the internal input/output lines for memory writing.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor memory, comprising:
a memory bank;
a write amplifier circuit, coupled to the memory bank through a plurality of internal input/output lines;
a plurality of input/output pins, coupled to the write amplifier circuit through a plurality of input lines; and
a plurality of address pins, configured to receive a column address instruction through a part of the plurality of address pins and receive an operation code through at least one of another part of the plurality of address pins during a data writing period,
wherein the semiconductor memory determines a part of the plurality of internal input/output lines for transmitting input data according to the operation code, and operates the write amplifier circuit to perform a partial writing mode according to the operation code so as to write the input data into the memory bank through the part of the plurality of internal input/output lines according to the column address instruction,
wherein the operation code comprises a specific partial writing instruction received through another one of another part of the plurality of address pins.

2. The semiconductor memory according to the claim 1, further comprising:
a control logic, configured to provide a mode register setting command;
an address register, coupled to the plurality of address pins, and configured to receive the column address instruction and the operation code; and
a mode register, coupled to the control logic and the address register, and configured to receive the mode register setting command provided by the control logic, and output a mode selection signal; and
an amplifier controller, coupled to the mode register and the write amplifier circuit, and configured to receive the mode selection signal to control the write amplifier circuit to perform the partial writing mode according to the mode selection signal.

3. The semiconductor memory according to the claim 2, further comprising:
a column address latch, coupled to the address register and the write amplifier, and configured to receive the column address instruction and the operation code provided by the address register,
wherein the column address latch provides the operation code to the write amplifier circuit, so that the write amplifier circuit is controlled by the amplifier controller to write the input data into the memory bank through the part of the plurality of internal input/output lines.

4. The semiconductor memory according to the claim 3, further comprising:
a column decoder, coupled to the column address latch and the memory bank,
wherein the column address latch provides the column address instruction to the column decoder, so that the column decoder determines a partial writing region in the memory bank according to the column address instruction.

5. The semiconductor memory according to the claim 4, further comprising:
a row address latch, coupled to the address register; and
a row decoder, coupled to the row address latch and the memory bank,
wherein the address register is further configured to receive a row address instruction through the address pins, and the row address latch is configured to receive the row address instruction provided by the address register and output the row address instruction to the row decoder, so that the column decoder and the row decoder determine the partial writing region in the memory bank according to the column address instruction and the row address instruction.

6. The semiconductor memory according to the claim 5, wherein the amplifier controller is further coupled to the column address latch, wherein the amplifier controller is configured to receive the specific partial writing instruction provided by the column address latch to control the write amplifier circuit to perform the partial writing mode in an on-the-fly manner.

7. The semiconductor memory according to the claim 6, wherein the specific partial writing instruction is 1-bit data.

8. The semiconductor memory according to the claim 1, wherein the internal input/output lines is classified into a plurality of input/output line groups, and the operation code comprises N-bits data, wherein the N is a positive integer, and the write amplifier circuit selects one of the plurality of input/output line groups according to the N-bits data to write the input data into the memory bank through the one of the plurality of input/output line groups.

9. The semiconductor memory according to the claim 1, wherein when the plurality of address pins receives a row address instruction through the plurality of address pins.

10. The semiconductor memory according to the claim 1, wherein the plurality of address pins are further configured to receive another column address instruction through the part of the plurality of address pins and the at least one of another part of the plurality of address pins are undefined during a data reading period.

11. The semiconductor memory according to the claim 1, further comprising:
a bank selection pin, configured to receive a bank selection instruction;
another memory bank; and
another write amplifier circuit, coupled to the another memory bank through another plurality of internal input/output lines, and coupled to the plurality of address pins through the plurality of input lines,
wherein the semiconductor memory selects the write amplifier circuit or the another write amplifier circuit to perform a partial writing on the memory bank or the another memory bank according to the bank selection instruction, so that the write amplifier circuit or the another write amplifier circuit writes the input data into the memory bank or the another memory bank through the part of the plurality of internal input/output lines or a part of the another plurality of internal input/output lines.

12. A partial writing method, adapted to a semiconductor memory, wherein the partial writing method comprises:
receiving a column address instruction through a part of a plurality of address pins and receiving an operation code through at least one of another part of the plurality of address pins during a data writing period;
determining a part of the plurality of internal input/output lines for transmitting input data according to the operation code; and
operating a write amplifier circuit to perform a partial writing mode according to the operation code to write the input data into a memory bank through the part of the plurality of internal input/output lines according to the column address instruction,
wherein the operation code comprises a specific partial writing instruction received through another one of another part of the plurality of address pins.

13. The partial writing method according to the claim 12, wherein the step of operating the write amplifier circuit to perform the partial writing mode comprises:
receiving the column address instruction and the operation code by an address register;
receiving a mode register setting command provided by a control logic and output a mode selection signal by a mode register; and
receiving the mode selection signal by an amplifier controller to control the write amplifier circuit to perform the partial writing mode according to the mode selection signal.

14. The partial writing method according to the claim 13, wherein the step of operating the write amplifier circuit to perform the partial writing mode further comprises:
receiving the column address instruction and the operation code provided by the address register by a column address latch; and
providing the operation code to the write amplifier circuit by the column address latch, so that the write amplifier circuit is controlled by the amplifier controller to write the input data into the memory bank through the part of the plurality of internal input/output lines.

15. The partial writing method according to the claim 14, wherein the step of operating the write amplifier circuit to perform the partial writing mode further comprises:
providing the column address instruction to a column decoder by the column address latch, so that the column decoder determines a partial writing region in the memory bank according to the column address instruction.

16. The partial writing method according to the claim 15, wherein the step of operating the write amplifier circuit to perform the partial writing mode further comprises:
receiving a row address instruction through the address pins by the address register;
receiving the row address instruction provided by the address register and outputting the row address instruction to the row decoder by row address latch; and
determining the partial writing region in the memory bank according to the column address instruction and the row address instruction by the column decoder and the row decoder.

17. The partial writing method according to the claim 16, wherein the step of operating the write amplifier circuit to perform the partial writing mode further comprises:
receiving the specific partial writing instruction provided by the column address latch by the amplifier controller to control the write amplifier circuit to perform the partial writing mode in an on-the-fly manner.

18. The partial writing method according to the claim 17, wherein the specific partial writing instruction is 1-bit data.

19. The partial writing method according to the claim 12, wherein the internal input/output lines is classified into a plurality of input/output line groups, and the operation code comprises N-bits data, wherein the N is a positive integer, and the step of operating the write amplifier circuit to perform the partial writing mode according to the operation code to write the input data into the memory bank according to the column address instruction comprises:
selecting one of the plurality of input/output line groups according to the N-bits data by the write amplifier circuit to write the input data into the memory bank through the one of the plurality of input/output line groups.

20. The partial writing method according to the claim 12, wherein when the plurality of address pins are configured to receive a row address instruction through the plurality of address pins.

21. The partial writing method according to the claim 12, wherein the partial writing method further comprises:
receiving another column address instruction through the part of the plurality of address pins and the at least one of another part of the plurality of address pins are undefined during a data reading period.

22. The partial writing method according to the claim 12, further comprising:
receiving a bank selection instruction by a bank selection pin;
selecting the write amplifier circuit or another write amplifier circuit to perform a partial writing on the memory bank or another memory bank according to the bank selection instruction; and
writing the input data into the memory bank or the another memory bank by the write amplifier circuit or the another write amplifier circuit through the part of the plurality of internal input/output lines or a part of the another plurality of internal input/output lines.

* * * * *